Aug. 8, 1967

L. W. SMART 3,335,296

SEMICONDUCTOR DEVICES CAPABLE OF SUPPORTING LARGE REVERSE VOLTAGES

Filed Nov. 10, 1965

2 Sheets-Sheet 1

WITNESSES

Edwin E. Bassler

James F. Young

INVENTOR

Lee W. Smart

BY Gordon H. Telfer

ATTORNEY

United States Patent Office 3,335,296 Patented Aug. 8, 1967

3,335,296

SEMICONDUCTOR DEVICES CAPABLE OF SUPPORTING LARGE REVERSE VOLTAGES

Lee W. Smart, Monroeville, Pa., assignor to Westinghouse Electric Corporation, Pittsburgh, Pa., a corporation of Pennsylvania Filed Nov. 10, 1965, Ser. No. 507,216
6 Claims. (Cl. 307—88.5)

This application is a continuation-in-part of application Ser. No. 115,550, filed June 7, 1961, now abandoned.

This invention relates in general to semiconductor devices such as diodes, transistors and controlled rectifiers capable of supporting large reverse voltages.

Recent availability of very high quality silicon single crystals has enabled the development of high power diodes and other semiconductor devices having a high degree of physical uniformity within the internal p-n junction region and the weak link of the junction is now the external or surface region of the junction.

Repeated tests conducted at high voltages show the main obstacle to high voltage reverse stability in power diodes results from surface breakdown at the periphery of the p-n junction. Such breakdown at the periphery of the p-n junction causes an excessive surface leakage current to flow around the junction thereby destroying or substantially decreasing the possible life of the diode and also reducing the peak inverse voltage capabilities of the diode.

Surface breakdown similarly reduces reverse ratings of other p-n junction devices such as transistors and controlled rectifiers.

Some of the factors causing adverse surface effects are known, although not necessarily well understood. Thin conducting films (metallic or otherwise) are sometimes inadvertently formed on the exposed semiconductor surface during processing. Inversion layers or channels are sometimes formed by stray charges on a surface. Ionized atoms of unwanted impurities may cause inversion layers. Crystalline imperfections, such as points, resulting from the junction forming process, as in the case of alloy fusion, may result in highly concentrated electric fields. Additionally, actual dielectric breakdown may occur in the atmosphere near the surface.

To minimize surface effects the prior art has developed post etching and surface passivation techniques. These have limited effectiveness and in some instances considerably complicate the manufacturing process.

Accordingly, it is the general object of this invention to provide new and improved high voltage p-n junction devices, such as diode rectifiers, transistors and controlled rectifiers, that are less subject to surface breakdown effects.

Another object of this invention is to provide a p-n junction device having an increased life, very high reverse voltage capabilities and a low forward voltage drop without requiring costly modification of the fabrication process.

Briefly, the present invention accomplishes the above cited objects by providing one or more auxiliary p-n junctions surrounding the main p-n junction whereby the high reverse voltages appearing across the device surface are divided or distributed among the number of p-n junctions present. Since the high reverse voltages are supported by a plurality of p-n junctions the surface leakage currents are reduced and the life and rating of the power device is increased.

Further objects and advantages of the invention will become apparent as the following description proceeds and feature sof novelty which characterize the invention will be pointed out with particularity in the claims annexed to and forming a part of this specification.

For a better understanding of the invention, reference may be had to the accompanying drawings in which.

The basic invention described herein could be applied to many types of p-n junction devices. However, in the interest of simplicity this description is principally directed to the embodiment of the invention in a p-type silicon power diode.

Figure 1:
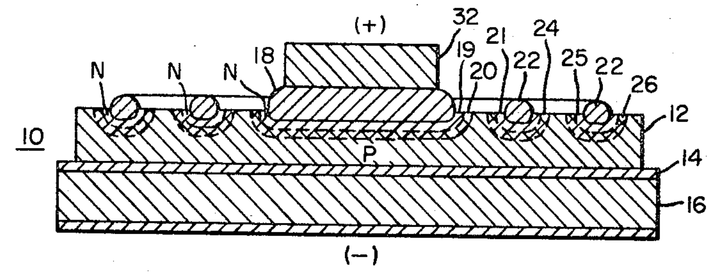
FIG. 1 is a sectional view of a diode rectifier representing an embodiment of this invention.
Figure 2:
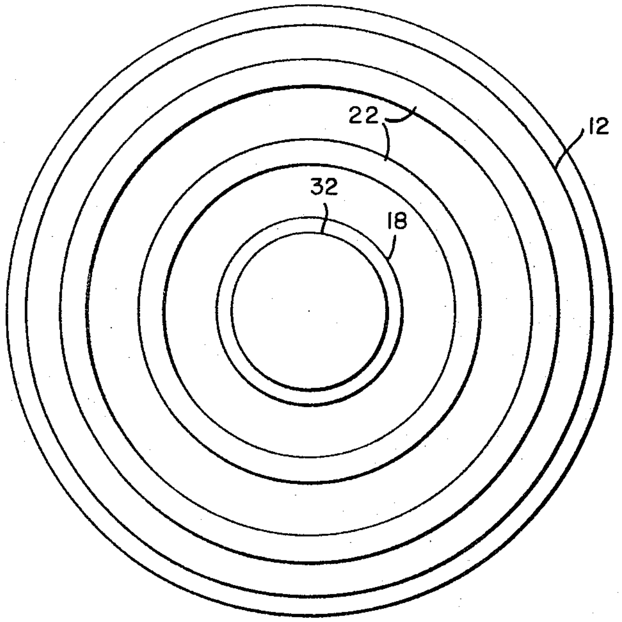
FIG. 2 is a plan view of the rectifier element of FIG. 1.

The construction of a junction rectifier element is shown greatly magnified in FIGS. 1 and 2 of the drawings. The rectifier element 10 consists of a wafer 12 of p-conductivity type silicon supported by a support member 16. The support member 16 is composed of a material having a good thermal and electrical conductivity and a thermal coefficient of expansion similar to that of the wafer 12. For example, the support member 16 could be made from a material such as molybdenum or tungsten. The silicon wafer 12 is secured to support member 16 by a thin layer of p-type solder 14 thereby making an ohmic contact between the silicon wafer 12 and the support member 16. A thin button 18 of n-conductivity type such as gold-antimony base alloy is placed coaxially with the silicon wafer 12 and fused into the wafer 12 thereby forming a main p-n junction 20 within the silicon wafer 12. The button 18, being smaller in diameter than the silicon wafer 12, has two spaced gold-antimony base alloy rings 22 concentric therewith and fused into the silicon wafer 12 thereby forming two circumferential auxiliary p-n junctions 24 and 26. The junctions 20, 24 and 26 are shown greatly exaggerated as the area between the dashed lines of FIG. 1 and as existing within the unalloyed bulk. The areas 19, 21 and 25 are zones of recrystallized silicon. A molybdenum or tungsten contact 32 is placed in ohmic contact on the gold-antimony base alloy button 18.

Although the above construction describes a device having two alloyed rings, it is to be understood that the number of rings used depends on the reverse voltage to which the device is to be subjected.

Figures 3, 4, 5:
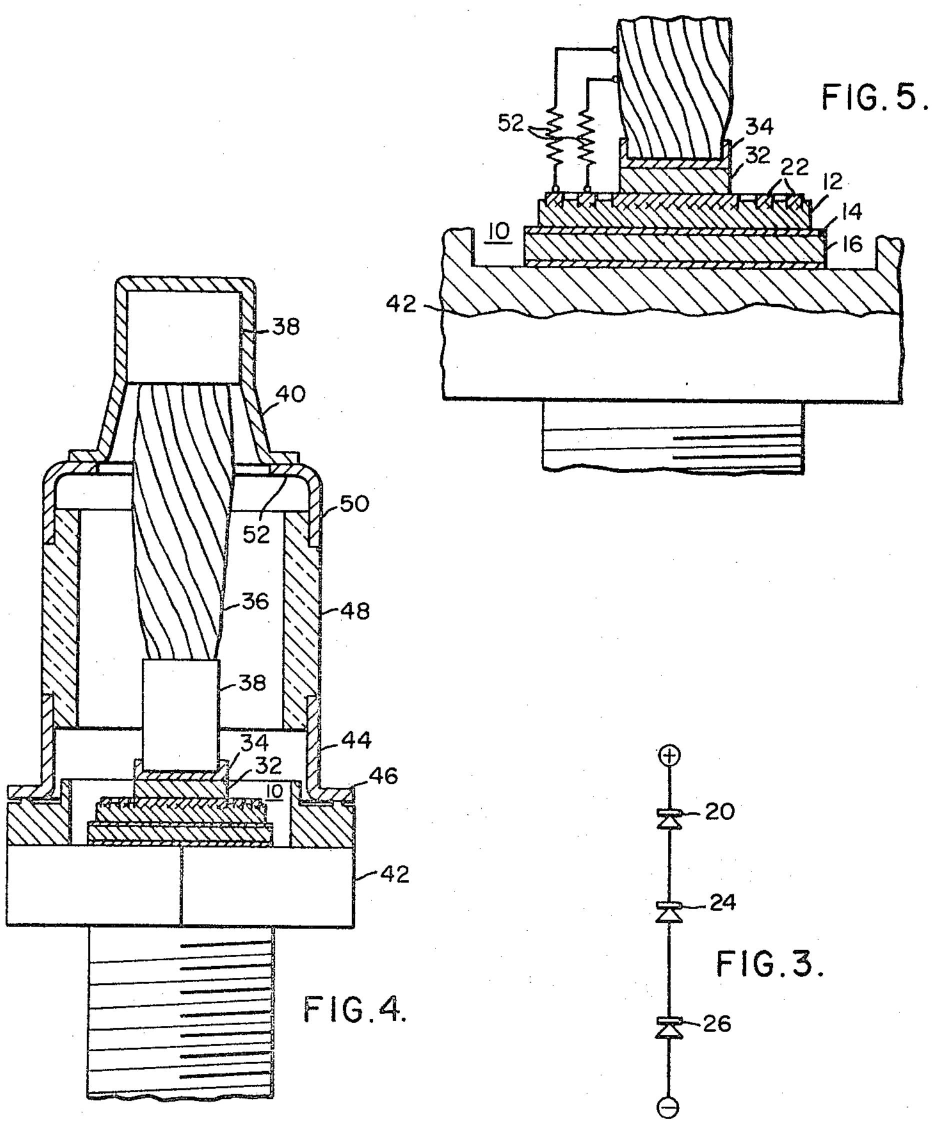
FIG. 3 represents schematically the effective circuit seen by the reverse surface leakage current.
FIG. 4 shows the embodiment of FIG. 1 in an enclosure.
FIG. 5 is a sectional view of a rectifier showing a bias voltage applied to the auxiliary junctions.

FIG. 3 depicts schematically the electrical circuit seen by the reverse surface leakage current of the rectifier of this invention having two alloyed rings 22 fused into the silicon wafer 12. Each rectifier of FIG. 3 represents a p-n junction as shown in FIG. 1 and has the same reference character as the junction of FIG. 1. For example, rectifier 20 of FIG. 3 represents the main junction 20 of FIG. 1 and rectifiers 24 and 26 in FIG. 3 represent the p-n junctions 24 and 26 respectively associated with the rings 22 of FIG. 1. It can be seen that the reverse voltage is divided among three p-n blocking junctions so that the rectifier will thereby support very high voltages before the reverse instability due to surface leakage currents become a problem. For example, rectifiers of this invention would be rated in the order of magnitude of a forward drop of 1 to 1.5 volts at 100 amps. and a peak inverse voltage capability of 1500 to 3000 volts.

In FIG.. 4 a copper cup is soldered to the contact 32 and the flexible copper conductor 36 having a copper sleeve 38 on one end is connected to the cup 34. A sleeve 38 on the other end of the conductor 36 contacts a metal cap 40 providing an electrical connection from an external circuit to the rectifying element 10. The rectifying element 10 is housed in a base member 42 having screw threads thereon to provide a second terminal for electrical contact. A cylindrical member 44 having an external flange 46 is attached to the base 42 and supports an insulating cylinder 48. Another cylinder 50 having an internal flange 52 is attached to the top of the insulating cylinder 48 providing support for the cap 40.

Rather than have the circumferential alloyed rings 22 float electrically, it may be desirable to apply a voltage to the rings as shown in FIG. 5. An electrical potential applied through a substantial impedance such as dropping resistor 52 to the circumferential rings 22 would increase the blocking capability of the rectifier. This is accomplished by distorting the depletion layer. That is the depletion layer due to the voltage on the rings 22 combines with the depletion layer due to the main junction to thereby increase the width of the resultant depletion region at the surface. This, of course, causes the rectifier to support higher reverse voltages across the surface of the rectifier element.

Figure 6:
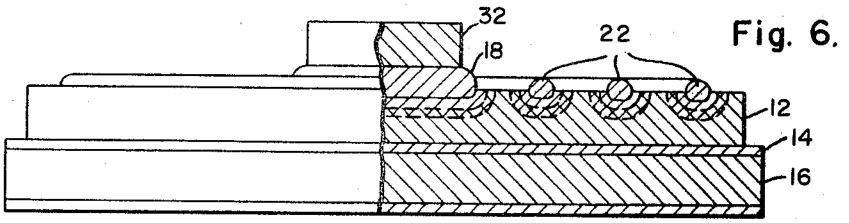
FIG. 6 is a partial sectional view of a rectifier element having three auxiliary alloyed rings; and, FIG. 7 is a sectional view of a controlled rectifier in accordance with the present invention.

As many or as few circumferential alloyed rings 22 as desired or as required by the magnitude of the reverse voltage to which the device is subjected in use may be added. FIG. 6 is a partial sectional view of a rectifying element having three circumferential alloyed rings 22.

This invention permits elimination of, or at least decreases the need for, post etching and other surface stabilizing techniques yet is thoroughly compatible with conventional fabrication techniques. A device can now be rated at or close to its bulk reverse breakdown voltage which may be quite high by known junction forming techniques.

While the invention has been principally described in connection with embodiments with alloyed junctions, improvement will also result from its use with other junction forming techniques such as vapor diffusion.

Figure 7:
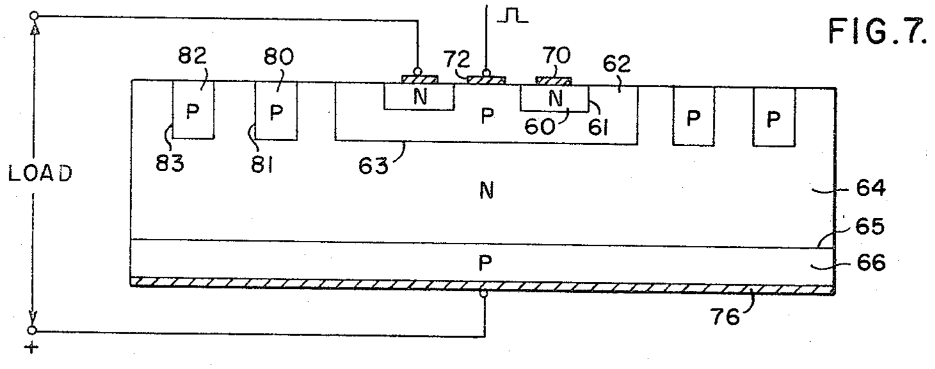

FIG. 7 shows an embodiment of the present invention in a controlled rectifier. The structure includes four successive regions 60, 62, 64 and 66 of alternate semiconductivity type with p-n junctions 61, 63 and 65 between adjacent pairs of regions. The cathode-emitter region 60 has, in this example, an annular configuration. Contacts 70, 72 and 76 are disposed, respectively, on the cathode-emitter region 60, the first base region 62 and the anode-emitter 66 to provide essential elements of a controlled rectifier. The second base region 64 in this example has no contact. Additionally, two regions 80 and 82 of p-type material forming p-n junctions 81 and 83 with n-type region 64 are provided surrounding the region 62 to minimize surface breakdown of the junction 63 making it possible for the device to withstand higher voltages without switching. Contacts 70 and 76 are load contacts for connection in a load circuit that, at least at times, has the indicated polarity that reverse biases the junction 63 between the first and second base regions 62 and 64. The contact 72 on region 62 is for the selective application of switching signals although the invention is also useful as practiced with four layer diodes wherein the contact 72 is absent.

As in the case of the diode rectifier 10 of FIG. 1, the device of FIG. 7 has two regions 62 and 64 of opposite conductivity type that define a junction 63 whose reverse breakdown voltage it is desired to improve by minimizing adverse surface effects. The load contacts 70 and 76 define a path on the surface of the device that crosses the junction.

Thus when the load circuit reverse biases the junction 63 there is a tendency to surface breakdown that is minimized by the extra regions 80 and 82 that surround it. The additional regions 80 and 82 are shown free of electrical contact. They may, however, have electrical contacts thereon but are kept free of direct conductive connection with other elements such as the region 62 and the load contacts 70 and 76. That is, the regions 80 and 82 are either electrically floating or they are connected to one of the other elements through a substantial impedance.

It is, therefore, clear that the invention may be applied to any semiconductor device having a junction whose reverse breakdown voltage it is desired to increase.

While there have been shown and described what are at present considered to be the preferred embodiments of the invention, modifications thereto will readily occur to those skilled in the art. It is not desired, therefore, that the invention be limited to the specific arrangements shown and described and it is intended to cover in the appended claims all such modifications that fall within the true spirit and scope of the invention.

What is claimed is:

1. In combination: a semiconductor device comprising first and second regions of, respectively, first and second types of semiconductivity with a p-n junction therebetween; a pair of electrical contacts on said device connected in a load circuit including a potential source that places a reverse bias across said p-n junction; at least one additional region of said first type of semiconductivity positioned adjacent said second region with a p-n junction therebetween; said at least one additional region surrounding and spaced from said first region and being free of electrical connection, said reverse bias being of a magnitude producing a depletion layer in material adjacent said p-n junctions wider at the surface of the device than that produced at only said junction between said first and second regions in the absence of said additional region.

2. In combination, the elements as defined in claim 1, wherein: said first and second regions comprise a rectifier with one of said pair of contacts on each of said first and second regions.

3. Electronic apparatus comprising: a wafer of semiconductive material of a first conductivity type having first and second opposed surfaces; a first region of a second conductivity type on the first surface of said wafer forming a first p-n junction therewith; a second region of said second conductivity type on the first surface of said wafer forming a second p-n junction therewith which surrounds said first p-n junction in predetermined spaced relation; a first electrode being disposed in ohmic contact with said first region; a second electrode being disposed in ohmic contact with the second surface of said wafer of semiconductive material; said second region being free of electrical connection; a potential source connected to said first and second electrodes, said source reverse biasing said first p-n junction with a potential of such magnitude that a depletion layer extends from said first p-n junction to said second p-n junction.

4. A method of operating a semiconductor device having first and second regions of opposite conductivity type with a first p-n junction therebetween, a pair of contacts on the device the path between which necessarily crosses the first p-n junction and a third region forming a second p-n junction with the second region that surrounds and is spaced from said first region, said method comprising: maintaining the third region free of electrical connection; applying to said contacts a voltage that reverses biases said first p-n junction and creates a depletion layer in the adjacent semiconductor material wider at the surface of the device than that produced at only said first p-n junction in the absence of said region.

5. The subject matter of claim 4 wherein: the device operated includes at least a fourth region forming a third p-n junction with the second region that surrounds and is spaced from said first and third regions which fourth region is also maintained free of electrical connection so that said depletion layer is even wider.

6. The subject matter of claim 4 wherein: said voltage applied to said contacts is of magnitude such that reverse breakdown of said first p-n junction would occur if said third region did not provide said wider depletion layer.

References Cited

UNITED STATES PATENTS

| | | | |
|---|---|---|---|
| 2,764,642 | 9/1956 | Shockley | 317—235 X |
| 2,919,388 | 12/1959 | Ross | 317—235 |
| 2,929,999 | 3/1960 | Bradley et al. | 317—235 X |
| 2,991,371 | 7/1961 | Lehovec | 307—88.5 |
| 3,026,424 | 3/1962 | Pomerantz | 307—88.5 |
| 3,035,186 | 5/1962 | Doucette | 307—88.5 |
| 3,076,104 | 1/1963 | Miller | 317—234 X |
| 3,087,098 | 4/1963 | Taylor | 317—234 |
| 3,087,099 | 4/1963 | Lehovec | 317—234 |
| 3,091,703 | 5/1963 | Statz. | |
| 3,099,591 | 7/1963 | Shockley. | |
| 3,113,220 | 12/1963 | Goulding et al. | 307—88.5 |
| 3,113,222 | 12/1963 | Czaczkowski | 307—88.5 |
| 3,148,284 | 9/1964 | Wertwijn | 317—234 X |
| 3,151,254 | 9/1964 | Feissel | 307—88.5 |
| 3,164,500 | 1/1965 | Benda. | |
| 3,210,560 | 10/1965 | Stehney | 317—234 X |
| 3,210,617 | 10/1965 | Kruper | 317—234 |

FOREIGN PATENTS

| | | |
|---|---|---|
| 233,119 | 4/1964 | Austria. |
| 915,688 | 1/1963 | Great Britain. |

JOHN W. HUCKERT, *Primary Examiner.*

A. M. LESNIAK, *Assistant Examiner.*